United States Patent [19]

de Chambost et al.

[11] Patent Number: 4,918,318

[45] Date of Patent: Apr. 17, 1990

[54] ELECTRONIC OPTICS DEVICE WITH VARIABLE ILLUMINATION AND APERTURE LIMITATION, AND APPLICATION THEREOF TO AN ELECTRON BEAM LITHOGRAPHIC SYSTEM

[75] Inventors: Emmanuel de Chambost, Molieres; Michel Sonrier, Bois D'Arcy, both of France

[73] Assignee: Thomson-CSF, Paris, France

[21] Appl. No.: 112,671

[22] Filed: Oct. 14, 1987

[30] Foreign Application Priority Data

Oct. 14, 1986 [FR] France ................................ 86 14261

[51] Int. Cl.⁴ ........................................... H01J 37/302
[52] U.S. Cl. .................................. 250/492.2; 250/398
[58] Field of Search ........... 250/492.2, 492.23, 492.24, 250/398, 396 R

[56] References Cited

U.S. PATENT DOCUMENTS 4,130,761 12/1978 Matsuda ........................... 250/492.2
4,282,437 8/1981 Boie .................................. 250/492.2
4,626,689 12/1986 Tomita et al. .................... 250/396 R

FOREIGN PATENT DOCUMENTS 2702446 7/1978 Fed. Rep. of Germany .
0093318 7/1981 Japan ................................. 250/492.2

OTHER PUBLICATIONS

Patent Abstracts of Japan, vol. 6, No. 136 (E-120) [1014], Jul. 23, 1982; & JP-A-57 62 531 (Fujitsu K.K.) 15-04-1982.
Patent Abstracts of Japan, vol. 10, No. 240 (E-429) [2296], Aug. 19, 1986; & JP-A-61 71 539 (Internatl Precision Inc.) 12-04-86.
IBM Technical Disclosure Bulletin, vol. 27, No. 2, Jul. 1984, pp. 1224–1225, New York, U.S.; M. Essig: "Critical koehler illumination concept for electron probe systems".

Primary Examiner—Jack I. Berman
Attorney, Agent, or Firm—Oblon, Spivak, McClelland, Maier & Neustadt

[57] ABSTRACT

An electronic optics device with variable illumination and aperture limitation is provided including, between a particle source and an object an image of which is desired to project in an image plane, a set of three lenses with electronically controllable focal lengths, the first one being situated as close as possible to the source and associated, in its main plane or in the vicinity of this plane, with an aperture limitation diaphragm, the object being placed in the main plane of the third lens or in the vicinity thereof, the focal length of these three lenses being controlled so as to give to the section of the electronic beam in the object plane a value determining the desired illumination and to the image of the diaphragm a diameter and a position determining the desired aperture of the beam.

4 Claims, 3 Drawing Sheets

FIG_1 PRIOR ART
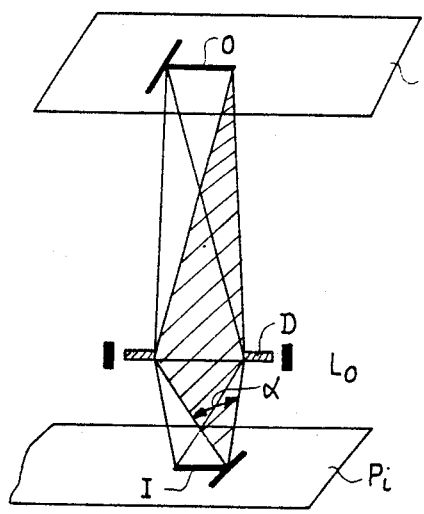
FIG_2 PRIOR ART
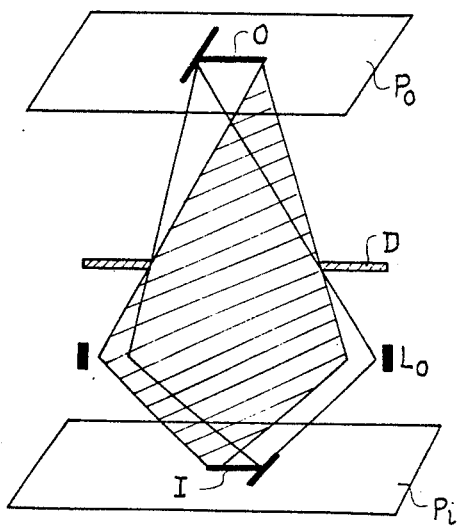
FIG_3 PRIOR ART
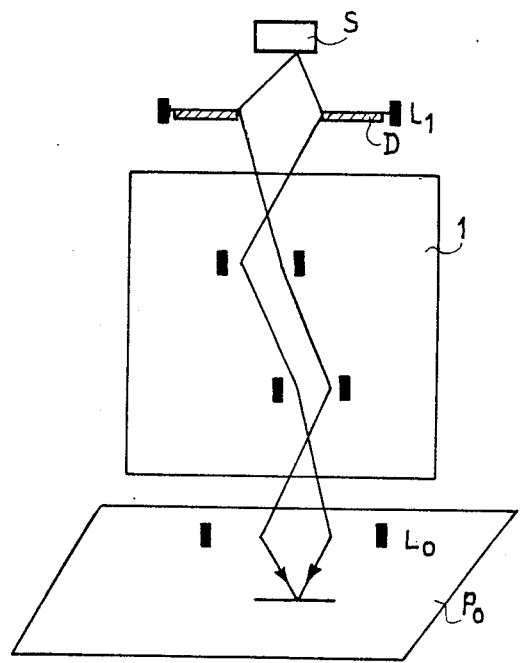

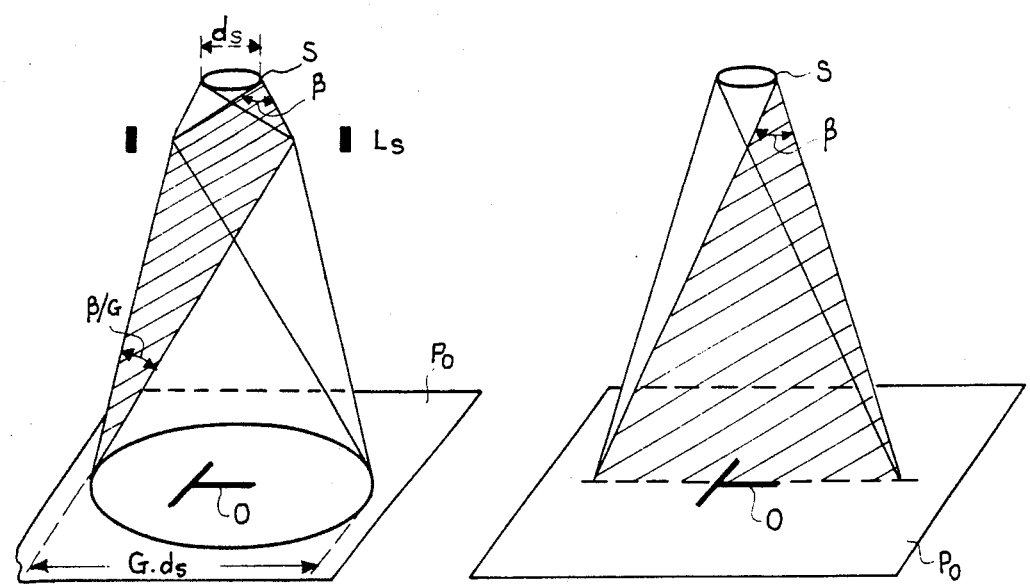

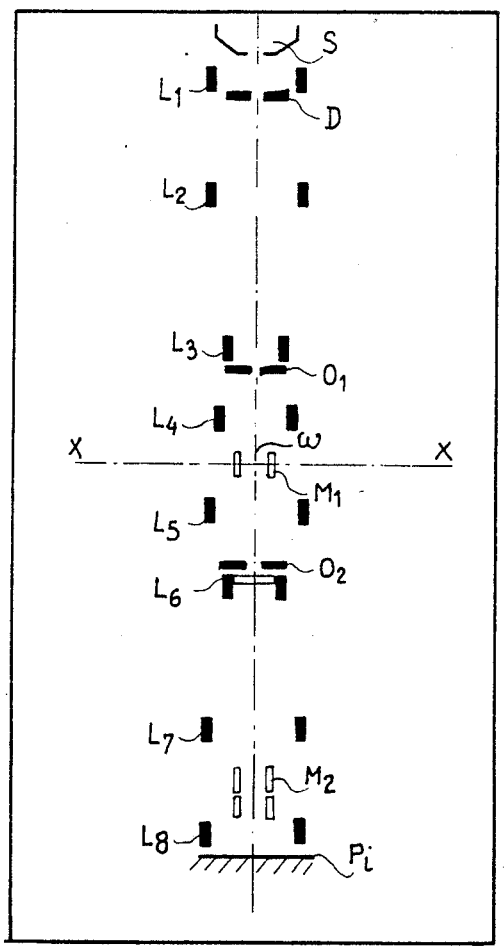
FIG_7
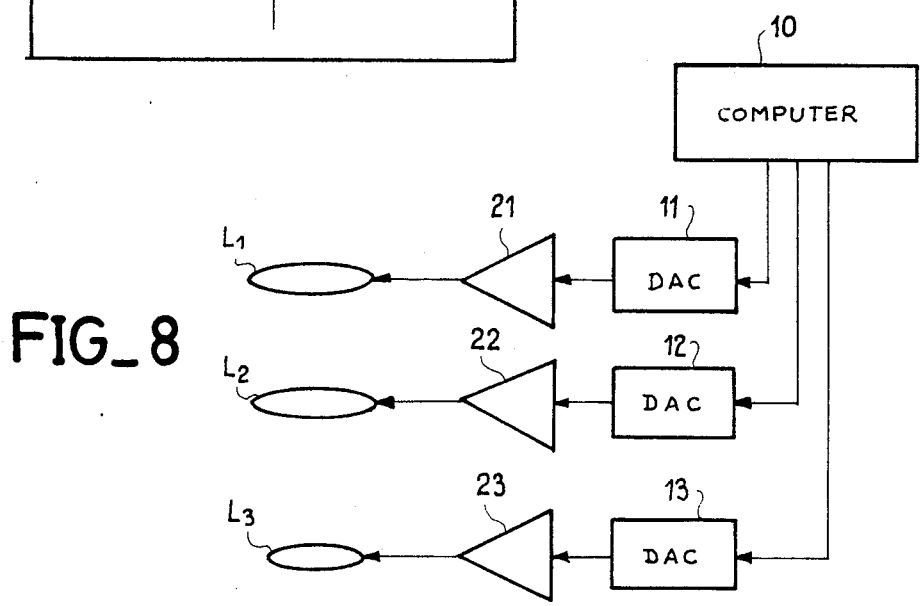
FIG_8

ELECTRONIC OPTICS DEVICE WITH VARIABLE ILLUMINATION AND APERTURE LIMITATION, AND APPLICATION THEREOF TO AN ELECTRON BEAM LITHOGRAPHIC SYSTEM

BACKGROUND OF THE INVENTION

1. Field of the Invention

The invention relates to the field of electronic optics, and more particularly to optical electron beam lithographic systems.

In electronic optics, it is frequently necessary to project, on a plane called "image plane", the image of an object materialized in a plane of the electronic optics system conjugate with the image plane. At every point of the image, the incident trajectories are inscribed in a cone of semi-aperture "α". This angle "α" should be related with the part used of the last lens called "objective" which cannot exceed certain limits without the risk of aberrations exceeding the required precision. Let us mention particularly:

spherical aberration, proportional to the cube of angle "α", chromatic aberration, proportional to the angle "α".

2. Description of the Prior Art

To limit the angle "α", the most usual solution, particularly in electronic microscopy apparatus, consists in disposing a diaphragm D in the main plane the objective LO as shown in FIG. 1, the objective forming in the image plane Pi an image of the object situated in the object plane PO.

A closely related solution consists in disposing the diaphragm D between the object plane or the last conjugate plane of the image plane and the main plane of the objective, as shown in FIG. 2. This solution may be selected when the penumbra defined in the main plane of the objective by the diaphragm and the last but one image is negligible with respect to the shadow of the diaphragm in the main plane. Its advantage is to leave place for a deflection system situated between the diaphragm and the objective, which need not necessarily have a pivot point in the plane of the diaphragm. This solution is often chosen for electron beam lithographic systems.

Another solution described in the French patent application 81 17846, and shown in FIG. 3, consists in disposing the aperture limiting diaphragm D as close as possible to the source S for example close to a first lens L1 and to design the electronic optic system 1 so that this diagram is conjugate with the main plane of the objective LO. This solution has the advantage of limiting from the beginning of the trajectories, the current of the charged particles and therefore of reducing as much as possible parasite effects of coulombic nature known under the name of "Boersch" effect or space charge effect.

In the above mentioned patent, it is explained that this solution may be particularly advantageous for so called "variable rectangular" or else "formed beam" electron beam lithographic systems.

In the three above mentioned cases, there exists a linear bi-univocal relationship between the diameter of the diaphragm materialized in the system and the angle "α". Thus, if it is desired to vary the angle "α", because from one use to the other the required precision is not the same, it is necssary to change the diaphragm, either by dismantling the system or by using a mechanical device with several positions, each position corresponding to a different diaphragm disposed in the path of the beam. Such a mechanical device has two drawbacks:

the mechanical complexity introduced into the system, the limitation of the number of values which may be attriuted to the angle "α", often only three values.

Furthermore, in such systems, it is necessary to determine the illumination of the object from the source;

Given a source of diameter $d_S$ which emits in a cone of semiaperture $\beta$, it is conventional to use a system of electronic lenses, $L_S$, for projecting on the object to be illuminated an image of the source whose diameter will be $G \times d_S$, for a beam aperture $\beta/G$; we then speak of critical illumination. This illumination mode is shown in FIG. 4.

It is also conventional to use an electronic lens system so that, in the plane of the object to be illuminated, the image of the source is thrown back to infinity and that thus an image of the angular diagram of the source is projected on the object. We then speak of KOHLER's illumination. This mode of illumination is shown in FIG. 5.

Nothing obviously prevents intermediate solutions between these two typical illuminations from being chosen.

SUMMARY OF THE INVENTION

The invention provides an electronic optics device in which the illumination and the aperture limitation are variable without any mechanical operation such as a change of diaphragm.

The invention also provides an electronic optics device intended, among other things, for illuminating an object from a source and projecting an image of this object on an "image plane", in which the aperture of the beam must be limited to an angle "α". A set of three lenses is used both for adjusting the illumination of the object and for varying the aperture "α" continuously using purely electronic means, without upsetting the other functions of the electronic optic system.

In accordance with the invention, an electronic optics device includes, between a particle source and an object situated in an object plane and an image of which is to be projected in an image plane, a set of three electronic lenses with electronically controllable focal lengths, the first one being situated as close as possible to the source and associated with an aperture limitation diaphragm situated in the vicinity of its main plane, the focal lengths of these three lenses being controlled so as to give, to the section of the particle beam in the object plane, a value determining the desired illumination and, to the image of the diaphragm, a diameter and a position determining the desired aperture for the incident beam on the object.

The invention also relates to the application of this device to an electron beam lithographic system.

BRIEF DESCRIPTION OF THE DRAWINGS

The invention will be better understood and other features will appear from the following description with reference to the accompanying Figures.

FIGS. 1 to 3 show known means for limiting the aperture of the electronic beam,

FIGS. 4 and 5 are two known examples of illumination means,

FIG. 6 shows schematicaly the electronic optics device of the invention,

FIG. 7 shows one application of the device of the invention in which the image to be projected is a composite image of two objects, and FIG. 8 shows the means for adjusting the focal length of the lenses of the device of the invention.

DESCRIPTION OF THE PREFERRED EMBODIMENT

The device of the invention is an electronic "optics" device, that is to say a device having electrostatic or magnetic "lenses" for concentrating a charged particle beam, as well as magnetic deflectors and diaphragms.

FIG. 6, includes a set of three lenses $L_1$, $L_2$, $L_3$ and a diaphragm D. This diaphragm D is situated close to the main plane of the first lens $L_1$. The curvature is made to be inserted between a particle source S and an "object" to be illuminated O. The first lens $L_1$ is situated as close as possible to the source and the main plane of the third lens $L_3$ is close to the plane $P_O$ of the object O.

In the ideal case where diaphragm D is effectively situated in the main plane of lens $L_1$ and where the object to be illuminated O is effectively in the main plane of lens $L_3$, before $L_3$ is taken into accounts, the definition of the respective images of the source and of the diaphragm produced by $L_1$ and $L_2$ account entirely for the action of these two lenses. Thus, by using the hypotheses relative to thin lenses which are acceptable here, and by assuming that b is the distance between the two lenses $L_1$ and $L_2$ and c is the distance between the two lenses $L_2$ and $L_3$:

The position of the image ID of diaphragm D with respect to the object plane $Z_{iD}$ is given by:

(1) $1/b - 1/(c - Z_{iD}) = 1/F_2$, where $F_2$ is the focal distance of L2.

The diameter $D_{iD}$ of the image of the diaphragm is given by (2) $d_{iD} = d_D \cdot (c - Z_{iD})/b$, where $d_D$ designates the diameter of the diaphragm.

From these two magnitudes may be deduced the aperature of the beam $\theta$ in the plane of the object to be illuminated:

(3) $\theta = d_{iD}/Z_{iD}$, which expression may be evaluated from the preceding relationships (1) and (2).

The three relationships (1), (2), (3), establish a biunivocal relationship $\theta = f(F_2)$.

Adjustment of the focal length $F_3$ of lens $L_3$ is then the means for varying the position $Z_{iiD}$ of the virtual diaphragm in accordance with the relationship:

(4) $Z_{iiD} = -1/(1/F_3 - 1/Z_{iD})$

Similarly, by applying the same conventional thin lens formulae, we may deduce successively the position $Z_{IS}$ and the diameter $d_{is}$ of the image of the source given by $L_1$, then the diameter $d_{iis}$ of the image of this image given by $L_2$, in plane $P_O$.

The position $Z_{IS}$ of the first image $I_S$ of source $I_S$ with respect to lens $L_2$ is given by:

$$\frac{1}{a} + \frac{1}{b - Z_{is}} = \frac{1}{F_1} \tag{5}$$

Position c of the second image of source $i_{is}$, with respect to lens $L_2$ is related to the focal length $F_2$ of $L_2$ by:

$$\frac{1}{Z_{is}} = \frac{1}{F_2} - \frac{1}{c} \tag{6}$$

The two relationships (5) and (6) determine the diameter $d_{iis}$ of the second image of the source:

$$d_{iis} = d_s \frac{b - Z_{is}}{a} + \frac{c}{Z_{is}} \tag{7}$$

Three relationships (5), (6), and (7) establish a biunivocal relationship as a function of $F_1$:

$$d_{iis} = f(F_1)$$

The positions and the diameters of the real or virtual images of the source and of the diaphragm given by lenses $L_1$ and $L_2$ account for the illumination of the object, as can be seen in FIG. 6.

To sum up, $L_2$ and $L_3$ may be used for determining the characteristics of the image of the diaphragm and, with $L_2$ and $L_3$ fixed, $L_1$ may be used for determining the characteristics of the image of the source and so of the section of the beam at the level of the object.

In the general case where the diaphragm is not exactly in the main plane of $L_1$, but close thereto, and where the main plane of $L_3$ does not exactly merge with the plane of the object, the three lenses $L_1$, $L_2$ and $L_3$ give the three degrees of freedom required for electronically adjusting the section of the beam in the plane of the object, the diameter and the position of the virtual diaphragm ID, image of the real diaphragm, determining the aperture of the beam.

It may be necessary, in microlithography, particularly, to use electronic optics systems where it is not a single object whose image is projected onto a target plane, but the composite image of two objects O1 and O2. This may be obtained by forming the image of a first object O1 on the plate of a second object O2, an projection system projecting a composite image composite of the two objects on a target plane Pi. The most simple case is that where the two objects are diaphragms with square aperture. In this case, the composite image will generally be a rectangle, and this rectangle will have variable dimensions if deflection means are disposed between the two object planes. The description of such systems is given for example in:

the article by J. Trotel, "Dynamic Beam Shaping", J. Vac. Sci. Technol., 15(3) May/June 1978, pages 872-873 in the account of the conference on microlithography held 30 Sept-2 Oct. by J. Trotel, "Electron Beam Direct Writing Lithographic System"

and in the article by E. de Chambost et al, "Fast electron pattern generator - High resolution" J. Vac. Technol. B4 (1), Jan/Feb 1986 pages 78-82.

FIG. 7 shows an electronic optics device in accordance with the invention, particularly adapted to the projection in plane Pi of a composite image of two objects 01 and 02.

In FIG. 7, $L_1$, $L_2$ and $L_3$ are the same lenses as those described above and are disposed as indicated. Two etched stencils are the two objects 01 and 02 mentioned above; these are diaphragms whose aperture is square. $L_4$ and $L_5$ are two identical lenses, associated in doublets, whose function is to form the image of stencil 01 in the plane of stencil 02. In the center of this doublet, symmetrical with respect to the axis XX, a magnetic deflector $M_1$ allows a variable composite rectangle to be produced at the level of the plane of 02. Two lenses $L_7$ and $L_8$ form a system for reducing this variable composite rectangle. An additional lens $L_6$ is used for making the plane of the deflection center $\omega$ of the deflector and the main plane of the last lens $L_8$ conjugate, so that the beam remains immobile in the objective lens $L_8$ when the deflector $M_1$ is activated for varying the dimensions of the composite rectangle. A double deflector $M_2$ allows the coordinates of the pattern projected in the image plane $P_i$ to be varied.

In this particularly interesting application of the invention, the focal length of $L_3$ is adjusted so that the deflection center $\omega$ of deflector $M_1$ is conjugate with the aperture limitation diaphragm D. Because the deflection center is also conjugate with the main plane of $L_8$, the image of the aperture limitation diaphragm is formed in the main plane of $L_8$, and any variation of focal distance of $L_2$ results in a variation of the diameter of the beam in the main plane of lens $L_8$, which is the desired aim. However, so that the variation of the diameter of the image of the diaphragm is not accompanied by defocusing of the image of this diagram, it is necessary to adjust the focal length of lens $L_3$ so that the plane of the aperture diaphragm remains indeed conjugate with the plane of the modulation deflector $M_1$, and so with the main plane of $L_8$.

For this particular system, as for any other system in accordance with the invention including the above defined set of three lenses and diaphragm, the relationship between the focal distance of the second lens $L_2$, the enlargement of the image ID of diaphragm D and the necssary correction which must be made to the focal length of $L_3$ may be tabulated and stored in a computer. Thus, it is also possible to readjust the focal length of the first lens $L_1$ whenever $L_2$ is varied. An extract from a table of values which must be stored in the computer for this particular example is given hereafter.

| Value Desired of $d_{ID}$ plane of $L_8$ (mm) | Focal Distance of $L_2$ (mm) | Focal Distance of $L_1$ (mm) | Focal Distance of $L_3$ (mm) |
| --- | --- | --- | --- |
| 400 | 10.33 | 10.3386 | 106 |
| 568 | 13 | 13.1 | 100 |

Of course a man skilled in the art knows the relationships between the focal distances of the lenses and the excitation currents of the lenses if it is a question of magnetic lenses or the voltages applied if it is a question of electrostatic lenses, to be applied to the lenses acting on the particle beam.

For one embodiment in which the lenses are magnetic lenses (respectively electrostatic lenses), the device of the invention would be the one shown in FIG. 8 where each numerical value coming from the memory of computer 10 is fed to a digital-analog converter 11, 12, 13 respectively, which controls, via an amplifier 21, 22 and 23 respectively, the excitation current (or the voltage) applied to the lenses $L_1$, $L_2$ and $L_3$.

What is claimed is:

1. An electronic optics device comprising a particle source and an object situated in an object plane, wherein an image of said object is to be projected onto an image plane located downstream from said object plane, and comprising a set of three electronic lenses with electronically controllable focal lengths between said source and said object plane, the first one being situated as close as possible to the source and associated with an aperture limitation diaphragm situated in the vicinity of its main plane, the focal lengths of these three lenses being controlled so as to give to the device three degrees of freedom required for electronically adjusting the section of the particle beam, in the object plane, thus determining the desired illumination and, the diameter and position of the image of the diaphragm, thus determining the desired aperture for the beam incident on the object.

2. The device as claimed in claim 1, wherein the lenses are magnetic lenses and in which the electronic controls are applied to the excitation currents of the magnetic lenses.

3. The device as claimed in claim 1, wherein the lenses are electrostatic lenses and in which the electronic controls are applied to the voltages for controlling the lenses.

4. The device as claimed in any one of the preceding claims, characterized in that the main plane of the third lens merges with the plane of the object.

* * * * *